United States Patent
Kim et al.

(10) Patent No.: US 7,799,677 B2
(45) Date of Patent: *Sep. 21, 2010

(54) DEVICE COMPRISING MULTI-LAYERED THIN FILM HAVING EXCELLENT ADHESIVE STRENGTH AND METHOD FOR FABRICATING THE SAME

(75) Inventors: Ju-Yong Kim, Suwon-si (KR); Ho-Jin Kweon, Suwon-si (KR); Jae-Jeong Kim, Seoul (KR); Jin-Goo Ahn, Suwon-si (KR); Oh-Joong Kwon, Cheonan-si (KR)

(73) Assignees: Samsung SDI Co., Ltd., Maetan-dong, Yeongtong-gu, Suwon-si, Gyeonggi-do (KR); Seoul National University Industry Foundation, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/385,621

(22) Filed: Apr. 14, 2009

(65) Prior Publication Data

US 2009/0200678 A1    Aug. 13, 2009

Related U.S. Application Data

(62) Division of application No. 11/250,120, filed on Oct. 14, 2005, now Pat. No. 7,545,043.

(30) Foreign Application Priority Data

Oct. 15, 2004    (KR) .................... 10-2004-0082581

(51) Int. Cl.
*H01L 21/44*    (2006.01)

(52) U.S. Cl. ............................... 438/660; 257/E23.162
(58) Field of Classification Search ................. 438/652, 438/656, 660, 686, 654; 257/761, E23.162
See application file for complete search history.

(56) References Cited

U.S. PATENT DOCUMENTS

| 3,641,402 | A | * | 2/1972 | Revitz et al. | ................. 257/750 |
| 3,793,175 | A | * | 2/1974 | Joly et al. | ............. 204/192.21 |
| 4,310,570 | A | * | 1/1982 | Calviello | .................... 438/605 |
| 6,194,310 | B1 | | 2/2001 | Hsu et al. | |
| 6,921,469 | B2 | | 7/2005 | Larsen | |
| 7,545,043 | B2 | * | 6/2009 | Kim et al. | .................... 257/761 |
| 2004/0108205 | A1 | | 6/2004 | Larsen | |

FOREIGN PATENT DOCUMENTS

| CN | 1233073 | 10/1999 |
| JP | 56-137463 U | 10/1981 |
| JP | 57-104221 | 6/1982 |
| JP | 2-024154 | 1/1990 |
| JP | 2001-345325 | 12/2001 |
| JP | 2002-329680 | 11/2002 |
| JP | 2003-264159 | 9/2003 |
| KR | 10-1997-0002438 | 3/1997 |
| KR | 10-1998-070383 | 10/1998 |
| KR | 10-2004-0066286 | 7/2004 |

* cited by examiner

*Primary Examiner*—Quoc D Hoang
(74) *Attorney, Agent, or Firm*—Robert E. Bushnell, Esq.

(57) ABSTRACT

A device comprises a multi-layered thin film having excellent adhesion due to the method of fabricating the same. More particularly, the device includes a multi-layered thin film consisting of a tantalum nitride layer, a tantalum layer formed on the tantalum nitride layer, and a gold thin film formed on the tantalum layer.

11 Claims, 3 Drawing Sheets

DEVICE COMPRISING MULTI-LAYERED THIN FILM HAVING EXCELLENT ADHESIVE STRENGTH AND METHOD FOR FABRICATING THE SAME

CROSS-REFERENCE TO RELATED APPLICATIONS AND CLAIM OF PRIORITY

This application is a divisional of Applicants' Ser. No. 11/250,120 filed in the U.S. Patent & Trademark Office on 14 Oct. 2005, now U.S. Pat. No. 7,545,043 and assigned to the assignee of the present invention. Furthermore, this application makes reference to, incorporates the same herein, and claims all benefits accruing under 35 U.S.C. §119 from an application for DEVICE COMPRISING MULTI-LAYERED THIN FILM HAVING EXCELLENT ADHESIVE STRENGTH AND METHOD FOR FABRICATING THE SAME earlier filed in the Korean Intellectual Property Office on 15 Oct. 2004 and there duly assigned Serial No. 10-2004-0082581.

BACKGROUND OF THE INVENTION

1. Technical Field

The present invention relates to a device including a multi-layered thin film having excellent adhesive strength and a method for fabricating the same. More particularly, the invention relates to a multi-layered thin film having excellent adhesive strength between layers and a method for fabricating the same.

2. Related Art

Generally, a semiconductor device includes aluminum (Al) or copper (Cu) as an electrical connecting material between members, such as an electric array. However, the device has been developed to increase its integration so that array width is decreased and total length is increased. Furthermore, in order to provide a device having more reliability and higher speed, it is preferable to use copper rather than aluminum in view of its smaller specific resistance and excellent electric migration or stress resistance.

Although copper has an excellent specific resistance compared to that of aluminum, adhesive strength with respect to a silicon substrate deteriorates since it has no protection layer in the form of an aluminum oxide layer such as $Al_2O_3$.

Furthermore, copper has a diffusion coefficient 100 times higher than that of aluminum, which facilitates diffusion into the interior of the silicon substrate so that the reliability of the device deteriorates. In order to prevent the diffusion, a diffusion barrier is required between the silicon layer and the copper layer.

Conventional diffusion barriers of a semiconductor device include titanium nitride (TiN), tantalum nitride (TaN), and tungsten nitride (WN) to prevent diffusion with respect to a metal material that is easily oxidized, such as aluminum (Al), zirconium (Zr), titanium (Ti), and chromium (Cr).

Among them, tantalum nitride layer is widely applied in a Micro Electro Mechanical System (hereinafter, referred to 'MEMS'), as well as in a semiconductor device. For example, it is applied to induce heat by applying an electric current to the tantalum nitride layer when local heating is required during operation of a device in the MEMS field.

A deposition method, such as reactive sputtering, is applied to provide the tantalum nitride layer. That is, the reactive sputtering method includes the steps of placing a target material of a tantalum disk into a deposition chamber, injecting a plasma source of an argon gas, the gas incorporating a thin film such as nitrogen or oxygen into the chamber, and processing with deposition. Such a sputtering method can be carried out on a silicon wafer or a Pyrex glass wafer in various ways, and it is widely applied, together with chemical vapor deposition, as a thin film deposition technique.

On the other hand, although gold (Au) has a slightly higher electrical conductivity compared to that of silver (Ag) or copper, it has the advantage of minimizing the contact resistance level occurring due to electrical contact with metal. Accordingly, gold is widely used as a current collector material and a metal electrode material in MEMS and fuel cell fields. For example, a reformer of a fuel cell has been developed as a form of a multi-layered thin film comprising a heating body of a tantalum nitride layer formed on a silicon substrate and an electrode of a gold thin film formed on the tantalum nitride layer.

However, when the gold thin film is directly formed on the tantalum nitride layer, a problem results in that the gold thin film is easily delaminated. That is, when different materials are deposited for the tantalum nitride layer and the gold thin film, the adhesive strength between these thin films deteriorates due to the stress (compressive stress) or the tensile strength caused by the different lattice constants between the different elements of each thin film, resulting in peeling off of the gold thin film.

Accordingly, a variety of research has been conducted to improve the adhesive strength between the tantalum nitride layer and the gold thin film.

For example, it has been suggested that the tantalum nitride layer and gold thin film are deposited in an orderly manner on the silicon substrate, and are subjected to heat treatment in order to decrease the stress and the tensile strength between layers due to the different lattice constants. Nonetheless, it does not improve the adhesive strength between layers.

Alternatively, it has been suggested that an additional thin layer, acting as an adhesive layer, be interposed between the tantalum nitride layer and gold thin film.

Korean Patent Publication No. 10-1997-0002438 discloses a thin film conductor for plating gold, including an adhesive layer of chromium or titanium for increasing the adhesive strength between a metal layer and a plated layer.

However, although such an adhesive layer is interposed, the gold thin film still, ultimately, peels off. In order to solve this problem, the heat treatment is carried out after interposing the adhesive layer, and thereby stress is decreased and adhesive strength between layers is increased.

Although the adhesive strength is increased by carrying out additional steps of providing an adhesive layer or heating, such a method should further include the step of shifting the reaction chamber to carry out the deposition process of chromium, titanium, or titanium-tungsten alloy, thereby, but this causes the problems of increased cost and the necessity of employing various production conditions.

Such problems may also occur in a buffer layer between the substrate and a metal thin film, besides the tantalum nitride layer.

SUMMARY OF THE INVENTION

The present invention has been developed in an effort to provide a device including a multi-layered thin film having excellent adhesive strength, and a method for fabricating the same, having the advantages of improving the adhesive strength between the tantalum nitride layer and the gold thin film.

An exemplary embodiment of a device including a multi-layered thin film having excellent adhesive strength, and a method for fabricating the same, according to the present invention comprises a multi-layered thin film, including a first layer selected from the group consisting of a nickel-chromium layer, a tantalum nitride layer, a tantalum silicon oxide (Ta—Si—O) layer, and a combination thereof, formed on a substrate, a second layer including a tantalum layer formed on the first layer, and a gold thin film formed on the second layer.

In a further embodiment, the present invention includes a method of fabricating a device comprising providing a first layer selected from the group consisting of a nickel-chromium layer, a tantalum nitride layer, a tantalum silicon oxide (Ta—Si—O) layer, and a combination thereof, formed on a substrate, providing a second layer comprising a tantalum layer on the first layer, providing a gold thin film on the second layer, and heat-treating the multi-layered thin films.

The first layer has a thickness of between 10 and 500 nm, preferably between 50 and 200 nm, and the second layer has a thickness of between 10 and 200 nm, preferably, between 10 and 50 nm.

The first layer and the second layer are fabricated in accordance with any conventional process selected from the group consisting of atomic layer deposition (ALD), chemical vapor deposition (CVD), physical vapor deposition (PVD), and plasma chemical deposition (PECVD). Particularly, when the first layer is a tantalum nitride layer, since both the first layer and the second layer are made of tantalum elements, it is possible to carry out the deposition steps successively in the same chamber, instead of carrying out an additional deposition in another chamber.

The gold thin film has a thickness of between 10 and 1500 nm, preferably between 30 and 1000 nm, and is formed in accordance with any conventional process selected from the group consisting of atomic layer deposition, chemical vapor deposition, physical vapor deposition, plasma deposition, electroplating, and electroless plating.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

According to the present invention, the adhesion strength between the first layer and the gold thin film is improved by providing an adhesive layer between the gold thin film and the first layer selected from the group consisting of a nickel-chromium layer, a tantalum nitride layer, tantalum silicon oxide (Ta—Si—O) layer, and a combination thereof The adhesive layer is, preferably, a tantalum layer.

According to the present invention, a substrate, a first layer selected from the group consisting of a nickel-chromium layer, a tantalum nitride layer, a tantalum silicon oxide (Ta—Si—O) layer, and a combination thereof, a second layer consisting of a tantalum layer, and a gold thin film are successively deposited to provide a multi-layered thin film.

Figure 1:
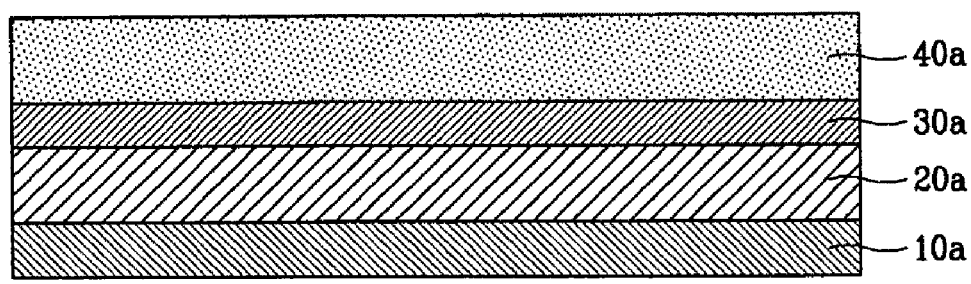
FIG. 1 is a cross-sectional view showing a multi-layered thin film for a device according to a first embodiment of the present invention.

FIG. 1 is a cross-sectional view showing a multi-layered thin film for a device according to a first embodiment of the present invention.

As shown in FIG. 1, a first layer of tantalum nitride 20a is provided on a substrate 10a.

The substrate 10a may be any substrate commonly available in the semiconductor device field, micro-reactor field, MEMS field, and fuel cell field, which typically include a silicon wafer or glass.

The first layer 20a is provided to prevent the diffusion of the gold thin film 40a to be provided in the following step, and is formed on a whole or a part of the surface of the substrate 10a in accordance with a process. The latter process may include any one selected from the group consisting of atomic layer deposition (ALD), chemical vapor deposition (CVD), physical vapor deposition (PVD), and plasma chemical deposition (PECVD), and is carried out in one chamber without exposure to the air.

In this case, the first layer 20a is formed with a thickness of 10 to 500 nm, preferably 50 to 200 nm.

Particularly, according to the first embodiment of the present invention, an adhesive layer 30a is provided between the first layer 20a and the gold thin film 40a, provided in the next step, in order to improve adhesive strength between the first layer 20a and the gold thin film 40a.

When the first layer 20a is tantalum nitride (TaN), the adhesive layer 30a is made of the same metal element as in tantalum nitride in order to improve adhesive strength. Therefore, as the adhesive layer 30a is made of tantalum, the same as in the tantalum nitride layer 20a, the lattice constants between the two layers 20a and 30a are similar to each other, thereby decreasing the stress or the tensile strength applied to each thin film.

Furthermore, when the first layer 20a is a tantalum nitride layer or a tantalum silicon oxide layer, it also has an advantage in that the tantalum nitride or tantalum silicon oxide grain boundary in the lower part of the first layer 20a is effectively filled by providing the tantalum adhesive layer 30a so that diffusion of a metal element of the gold thin film is prevented.

The tantalum adhesive layer 30a of the first embodiment of the present invention maintains a suitable adhesive strength between the first layer 20a and the gold thin film 40a. It has a thickness of between 10 and 200 nm, preferably, between 10 and 50 nm considering the diffusing level of the gold element. In this case, the forming process of the tantalum adhesive layer 30a is carried out in the same manner as for the first layer 20a. Particularly, it is possible to successively form the tantalum adhesive layer 30a after depositing the first layer 20a in the same chamber, so that the present invention prevents the complication of shifting to another chamber and setting new process conditions, as well as the increase in the cost of production, characteristic of prior techniques.

A conductive thin film in the form of gold thin film 40a is deposited on the tantalum adhesive layer 30a. The gold thin film 40a minimizes the contact resistance resulting from electrical contact with a metal laminated thin film, and has a thickness of 30 to 1000 nm.

It is possible to provide the gold thin film 40a with a thickness of around 1500 nm due to its excellent adhesive strength compared to that of the case where it is directly formed on the surface of the first layer. The gold thin film 40a is formed in accordance with a conventional process well known in this field, such as atomic layer deposition, chemical vapor deposition, physical vapor deposition, plasma chemical deposition, electroplating, and electroless plating.

Then, the provided multi-layered thin film, in which the substrate 10a, the first layer 20a, the second layer 30a and the gold thin film 40a are successively laminated, is subjected to heat treatment to increase the adhesive strength between layers.

The heat treatment is carried out at a temperature of 250 to 800° C., preferably 300 to 500° C. Furthermore, the heat treatment is preferably carried out under an air, oxygen, nitrogen, or inactive atmosphere. The heat treatment duration is not limited, but may be continued for several seconds to 5 hours.

Such heat treatment suitably releases the stress and tensile strength of the thin film so that the adhesive strength between layers is increased.

Furthermore, the device according to the first embodiment of the present invention maintains a suitable adhesive strength with respect to a gold thin film, even if a natural oxide layer is formed on an adhesive layer consisting of a tantalum layer.

Figure 2:
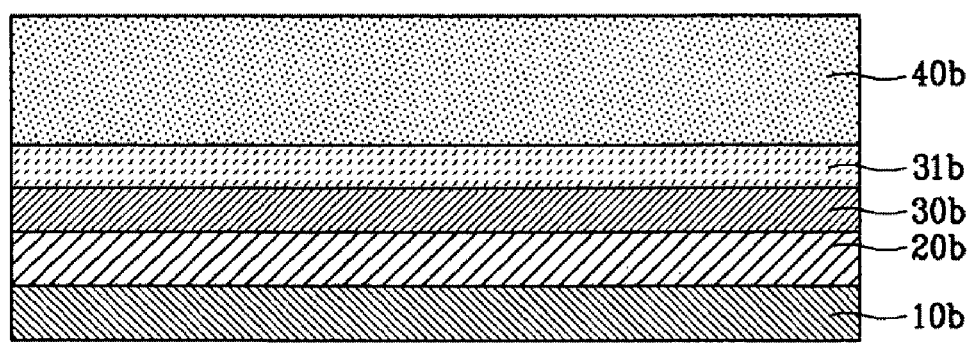
FIG. 2 is a cross-sectional view showing a multi-layered thin film for a device according to a second embodiment of the present invention.

FIG. 2 is a cross-sectional view showing a multi-layered thin film for a device according to a second embodiment of the present invention.

As shown in FIG. 2, the multi-layered thin film of the present invention includes a first layer 20b selected from the group consisting of a nickel-chromium layer, a tantalum nitride layer, a tantalum silicon oxide (Ta—Si—O) layer, and a combination thereof, formed on a substrate 10b, a second layer 30b comprising a tantalum layer formed on the first layer 20b, a third layer 31b comprising a tantalum oxide layer formed on the second layer 30b, and a gold thin film 40b formed on the third layer 31b.

In particular, the second layer (tantalum layer) 30b is deposited and allowed to stand 18 exposed to air in order to induce a natural oxidation so as to provide the third layer 31b (tantalum oxide layer) according to the present invention. In accordance with the present invention, the adhesive strength is not decreased even though the oxide layer is provided.

The provided multi-layered thin film is, preferably, applied to the field for providing the gold thin film. In particular, the internal diffusion of the gold element is prevented by providing a tantalum nitride layer in the lower part of the gold thin film, and the adhesive strength between these thin films is increased by providing the tantalum layer between the gold thin film and the tantalum nitride layer.

In addition, since it is possible to continuously carry out the process of forming a tantalum layer after the process of forming the tantalum nitride layer in the same chamber, there is a substantial advantage in that the vacuum is not broken and additional processes, such as shifting it to another chamber, are not necessary so that cost is reduced.

The multi-layer thin film according to the present invention can be applied to a conventional semiconductor device, a micro reactor, a MEMS field, and a fuel cell field such as a micro reformer.

Specifically, the device of the present invention may be applied to the array member of a semiconductor device so that an array short problem does not occur, even in a highly integrated conventional device, and the provided device has a low specific resistance, high stress and electrical movement, and high operating speed so as to provide a reliable device.

In addition, the device of the present invention may be applied to a fuel cell field, particularly to a reformer for modifying fuel to generate hydrogen gas, and for supplying the generated hydrogen gas to a fuel cell body, so that the hydrogen gas is safely and rapidly generated and the power output of the fuel cell is increased.

It can also be applied to a device requiring a small electric heating device in the MEMS field, and to an electrode for supplying electric power to decrease the contact resistance and to increase the consuming efficiency of the electric power.

The following examples illustrate the present invention in more detail. However, it is to be understood that the present invention is not limited by these examples.

EXAMPLE 1

Fabrication of Multi-layered Thin Film Laminated by Substrate/Tantalum Nitride Layer/Tantalum Layer/Gold Thin Film Successively An n-type silicon wafer was placed in a chamber, and nitrogen and tantalum were sputtered onto the wafer and deposited until the tantalum nitride layer had a thickness of 80 nm.

Then, tantalum was sputtered with a tantalum sputter target while maintaining a vacuum so as to deposit a tantalum layer on the tantalum nitride layer, and the process was continued until the thickness of the tantalum layer was 10 nm.

The provided multi-layered thin film of a tantalum layer/tantalum nitride/silicon was sputtered with a gold element to provide a gold thin film of 60 nm.

The resultant multi-layered thin film was subjected to heat treatment in an air atmosphere of 300° C. for 3 hours to provide a multi-layered thin film in which the gold thin film was stably formed.

EXAMPLE 2

Fabrication of Multi-layered Thin Film Laminated by Substrate/Tantalum Nitride Layer/Tantalum Layer/Gold Thin Film Successively A multi-layered thin film was fabricated in accordance with the same procedure as in Example 1, except that the gold thin film was formed so as to be 1000 nm thick.

EXAMPLE 3

Fabrication of Multi-layered Thin Film Further Comprising Tantalum Oxide

A multi-layered thin film was fabricated in accordance with the same procedure as in Example 1, except that the multi-layered thin film including the tantalum layer was allowed to stand exposed to air in order to provide a tantalum oxide layer ($Ta_2O_5$) on the tantalum layer.

EXAMPLE 4

Fabrication of Multi-layered Thin Film Heated under Nitrogen Atmosphere

The multi-layered thin film provided from Example 1 was heated at 400° C. in a nitrogen atmosphere to provide a multi-layered thin film.

EXAMPLE 5

Fabrication of Multi-layered Thin Film Heated under Inert Atmosphere

The multi-layered thin film provided from Example 1 was heated at 600° C. in a halogen atmosphere to provide a multi-layered thin film.

COMPARATIVE EXAMPLE 1

Fabrication of Multi-layered Thin Film Laminated by Substrate/Tantalum Nitride Layer/Gold Thin Film Successively An n-type silicon wafer was placed in a chamber, and nitrogen and tantalum were sputtered onto the wafer and deposited to provide a tantalum nitride layer having a thickness of 80 nm.

Then, the provided multi-layered thin film of tantalum nitride/silicon was sputtered with a gold element to provide a gold thin film having a thickness of 60 nm.

The resultant multi-layered thin film was subjected to heat treatment in an air atmosphere at 300° C. for 3 hours to provide a multi-layered thin film.

COMPARATIVE EXAMPLE 2

Fabrication of Multi-layered Thin Film Laminated by Substrate/Tantalum Nitride Layer/Tantalum Layer/Gold Thin Film Successively A multi-layered thin film was fabricated in accordance with the same procedure as in Example 1, except that the heating process was omitted.

COMPARATIVE EXAMPLE 3

Fabrication of Multi-layered Thin Film in which Substrate/Tantalum Nitride Layer/Copper Layer/Gold Thin Film are Successively Laminated A multi-layered thin film including an adhesive layer consisting of a copper layer instead of a tantalum layer was provided.

Initially, a tantalum nitride layer was formed on a substrate in accordance with the same procedure as in Example 1.

The provided thin film was moved to another reaction chamber having a target of copper, and the tantalum nitride layer was then sputtered with copper to provide a copper layer having a thickness of 10 nm.

Subsequently, a gold thin film was formed on the copper layer in accordance with the same procedure as in Example 1, and was heated to provide a multi-layered thin film.

COMPARATIVE EXAMPLE 4

Fabrication of Multi-layer thin film in which Substrate/Tantalum Nitride Layer/Copper Layer/Gold Thin Film are Successively Laminated A gold thin film was formed on the copper layer with a thickness of 100 nm in accordance with the same procedure as in Comparative Example 3.

However, surface defects, such as a crack, occurred on the provided gold thin film so that it was impossible to proceed with this test.

EXPERIMENTAL EXAMPLE 1

Test 1 for Adhesive Strength

Multi-layered thin films provided from the above Examples and Comparative Examples were subjected to a peel off test ten times with 3M tape in accordance with an ASTM D3359-97 X-cut tape test, and the average results thereof are shown in the following Table 1.

TABLE 1

|  | Example 1 | Example 2 | Example 3 | Example 4 | Example 5 | Comparative Example 1 | Comparative Example 2 | Comparative Example 3 |
|---|---|---|---|---|---|---|---|---|
| results | 5A | 5A | 5A | 5A | 4A | 0A | 0A | 2A |

5A: no peel off occurred
4A: thin film was smeared around the cutting line
3A: thin film was held up around the cutting line to a height of 1/16 in.
2A: thin film was held up around the cutting line to a height of 1/8 in.
1A: most thin film peeled off and film only slightly remained
0A: thin film was completely peel off with nothing remaining As shown in Table 1, the present invention provided the adhesive layer of the multi-layered thin film consisting of a tantalum layer or a tantalum oxide layer/tantalum layer, and the provided multi-layered thin film had suitable adhesive strength so that the gold thin film was not smeared on the tape.

However, in Comparative Example 1 since there was no adhesive layer, all of the gold thin film was smeared on the tape in the adhesive test, showing that the adhesive strength between the gold thin film and the lower part of tantalum nitride layer was very poor.

Comparative Example 2 provided an adhesive layer consisting of a tantalum layer but was not subjected to heat treatment so that the adhesive strength between the gold thin film and the tantalum nitride layer was not increased.

Furthermore, Comparative Example 3 provided an adhesive layer consisting of a copper layer but the adhesive strength was only slightly increased compared to that of Comparative Example 1.

EXPERIMENTAL EXAMPLE 2

Test 2 for Adhesive Strength

The Examples and Comparative Examples were heated at 200° C., 300° C., and 500° C., for 3 hours, and the adhesive strength of each was measured in accordance with the same procedure as in Experimental Example 1 in order to determine the relationship between temperature and adhesive strength.

It was found that the adhesive strength was sharply increased around 300° C. from the result that it was 1 A at around 200° C., but it was 5 A at around 300° C., and it was 4 A at around 500° C.

EXPERIMENTAL EXAMPLE 3

Surface Nature

Figure 3:
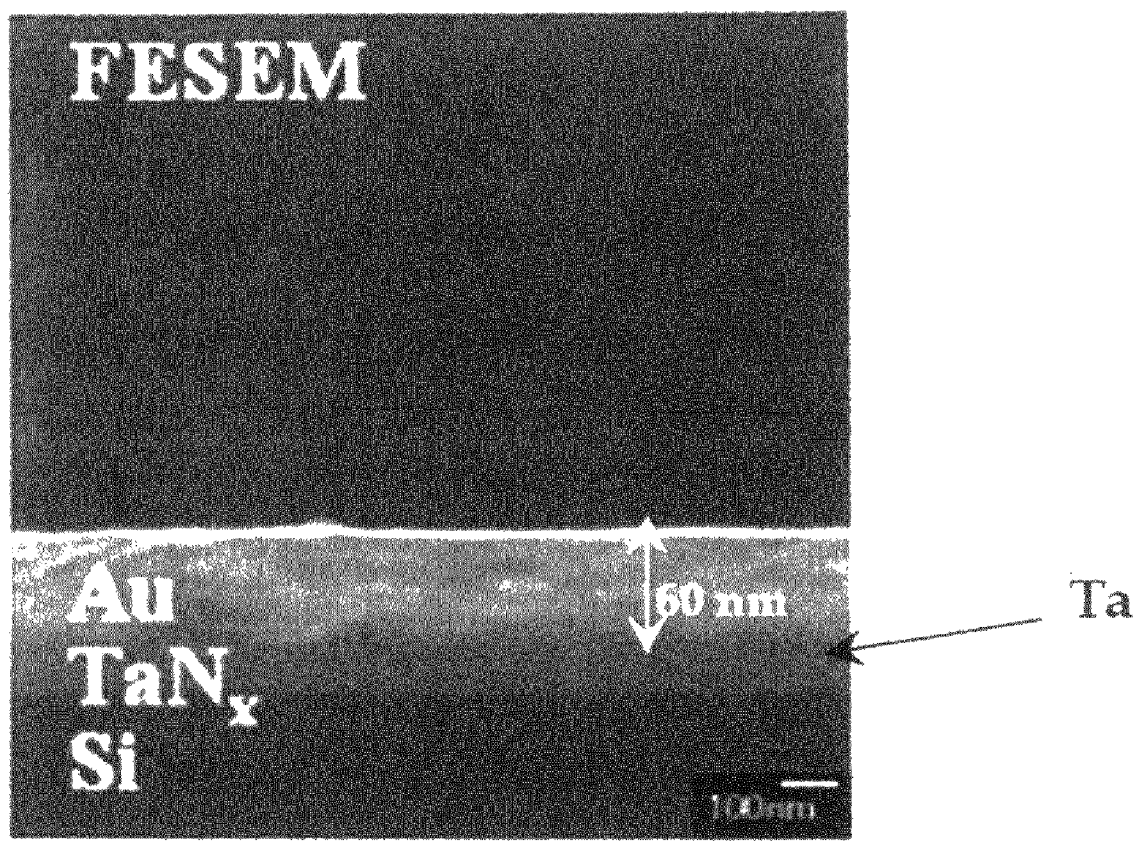
FIG. 3 is an FESEM photograph showing a multi-layered thin film provided in Example 1.
Figure 4:
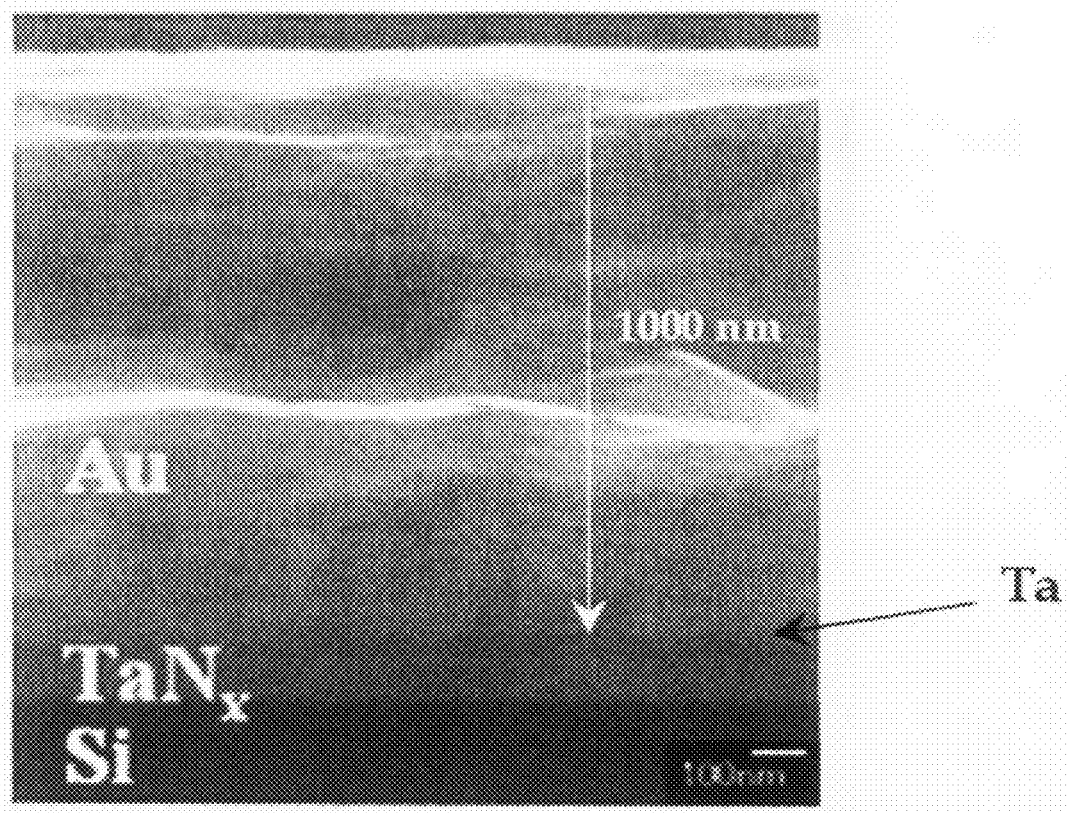
FIG. 4 is an FESEM photograph showing a multi-layered thin film provided in Example 2.

The cross-sections of the multi-layered thin films obtained from Examples 1 and 2 were measured for FESEM (Field Emission Scanning Electron Microscopy), and a microscope photograph obtained is shown in FIGS. 3 and 4.

As shown in FIGS. 3 and 4, the adhesive layer consisting of a tantalum layer was formed with a very small thickness of 10 nm, and the results of Table 1 show that an increase in the adhesive strength between the gold thin film and the tantalum nitride layer is to be expected. Although the tantalum layer was too thin to observe by FESEM, the tantalum nitride layer without the tantalum layer had an average surface resistance of 28.3 ohm/sq, but the tantalum nitride layer with the tantalum layer had an average surface resistance of 26.7 ohm/sq. From this fact, it was confirmed that it was deposited with tantalum.

Furthermore, the gold thin film of FIGS. 3 and 4 had thicknesses of 60 nm and 1000 nm, respectively, and it was confirmed that the gold thin film was stably formed, even if thickness was increased.

As described above, the adhesive layer of the present invention comprised a tantalum layer so as to provide a multi-layered thin film laminated by gold thin film/tantalum layer/ tantalum nitride, successively.

The multi-layered thin film according to the present invention includes an adhesive layer comprising a tantalum layer so as to improve adhesive strength between the gold thin film and the tantalum nitride layer. In addition, the tantalum layer is formed in the same chamber as the chamber in which the tantalum nitride layer is formed. Thereby, the present invention achieves cost savings by omitting the step of breaking the vacuum or shifting it to another chamber.

In addition, the multi-layered thin film is applied to a semiconductor process for forming a thin film or a MEMS field so as to improve the adhesive strength relative to the substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of fabricating a device, comprising the steps of:
providing a first layer selected from a group consisting of a nickel-chromium layer, a tantalum nitride layer, a tantalum silicon oxide (Ta—Si—O) layer, and a combination thereof, and formed on a substrate;
providing a second layer comprising a tantalum layer disposed on the first layer so as to form a multi-layered thin film:
providing a gold thin film on the second layer so as to further form the multi-layered thin film; and
heat-treating the multi-layered thin film.

2. The method of claim 1, further comprising the step of providing a natural oxidization tantalum layer between the step of providing the second layer and the step of providing the gold thin film.

3. The method of claim 2, wherein the natural oxidization tantalum layer is formed by exposing the second layer to for a predetermined time.

4. A multi-layered thin film device made by the method of claim 3.

5. The method of claim 1, wherein the second layer and the natural oxidization tantalum layer are formed by a process selected from a group consisting of atomic layer deposition (ALD), chemical vapor deposition (CVD), physical vapor deposition (PVD), and plasma chemical deposition (PECVD).

6. The method of claim 1, wherein the gold thin film is formed by a process selected from a group consisting of atomic layer deposition, chemical vapor deposition, physical vapor deposition, plasma chemical deposition, electroplating, and electroless plating.

7. The method of claim 1, wherein the heat treating step is carried out at a temperature of 250° C. to 800° C.

8. A multi-layered thin film device made by the method of claim 7.

9. The method of claim 1, wherein the heat treating step is carried out in an atmosphere comprising one of air, oxygen, nitrogen and an inactive atmosphere.

10. The method of claim 1, wherein the device is selected from a group consisting of a semiconductor device, a microreactor, a micro electro mechanical system (MEMS), and a fuel cell.

11. A multi-layered thin film device made by the method of claim 1.

* * * * *